US006637641B1

(12) United States Patent
Downes et al.

(10) Patent No.: US 6,637,641 B1
(45) Date of Patent: Oct. 28, 2003

(54) SYSTEMS AND METHODS FOR MANUFACTURING A CIRCUIT BOARD

(75) Inventors: Stuart D. Downes, Milford, MA (US); Jin Liang, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/139,500

(22) Filed: May 6, 2002

(51) Int. Cl.[7] .................................................. B23K 3/08
(52) U.S. Cl. ....................... 228/102; 228/248.1; 228/23; 228/35; 228/41; 228/43
(58) Field of Search ........................... 228/22, 23, 19, 228/33, 36, 38, 41, 43, 102, 248.1, 8–11

(56) References Cited

U.S. PATENT DOCUMENTS

| | | | | |
|---|---|---|---|---|
| 4,934,309 A | * | 6/1990 | Ledermann et al. | 118/50 |
| 5,482,736 A | * | 1/1996 | Glenn et al. | 427/96 |
| 5,505,367 A | * | 4/1996 | Degani et al. | 228/248.1 |
| 5,882,720 A | * | 3/1999 | Legault et al. | 427/8 |
| 5,938,106 A | * | 8/1999 | Pierson | 228/246 |
| 5,975,402 A | * | 11/1999 | Kim | 228/6.2 |
| 6,062,460 A | * | 5/2000 | Sato | 228/119 |
| 6,386,434 B1 | * | 5/2002 | Wong | 228/248.1 |
| 6,491,204 B1 | * | 12/2002 | Erdmann | 228/22 |
| 2001/0000906 A1 | * | 5/2001 | Yoshikawa et al. | 228/248.1 |

* cited by examiner

Primary Examiner—M. Alexandra Elve
Assistant Examiner—Kevin McHenry
(74) Attorney, Agent, or Firm—Chapin & Huang, L.L.C.; David E. Huang, Esq.

(57) ABSTRACT

A circuit board manufacturing system has a paste source, a circuit board processing apparatus, and a controller. The circuit board processing apparatus includes a carrier configured to receive a circuit board having (i) a section of circuit board material and (ii) virgin metallic surface mount pads supported by the section of circuit board material. The circuit board processing apparatus further includes a paste distribution assembly coupled to the carrier and to the paste source. The paste distribution assembly is configured to dispose a paste from the paste source onto a surface of the circuit board. The carrier further includes a surfacing assembly coupled to the carrier. The surfacing assembly is configured to move the paste over the surface of the circuit board to remove a portion of each virgin metallic surface mount pad. The controller is configured to selectively start and stop operations of the paste distribution and surfacing assemblies.

20 Claims, 6 Drawing Sheets

SYSTEMS AND METHODS FOR MANUFACTURING A CIRCUIT BOARD

One conventional circuit board includes pads which are formed using nickel and gold immersion technologies. These circuit boards typically include standard copper traces supported by layers of fiberglass (e.g., FR4 fiberglass) which are glued together. Some of the copper traces terminate at nickel/gold surface mount pads, i.e., nickel pads plated with a gold finish, which are configured to solder to surface mount devices such as Ball Grid Array (BGA) devices.

To manufacture a circuit board having nickel/gold immersion pads, a manufacturer typically forms individual circuit board layers, i.e., individual layers of fiberglass having etched copper traces thereon, using an acid etch process. Next, the manufacturer typically glues the individual layers together, as well as cuts and drills edges, grooves and holes to form the section of circuit board material. Then, the manufacturer typically forms nickel pads and nickel plated-through holes by exposing the section of circuit board material to a nickel immersion process, e.g., by placing the circuit board section in a bath containing nickel and other additives that facilitate reliable and consistent pad growth such as phosphates, sulfides, etc. Next, the manufacturer typically provides a protective coating of gold to inhibit nickel oxidation. It should be understood that the manufacturer typically performs additional cleaning steps (e.g., rinsing steps) along the way (e.g., interspersed within the above-described series of manufacturing steps) to clean the section of circuit board material of residues, byproducts and contaminants.

The end result circuit board includes a section of circuit board material which supports a set of virgin surface mount nickel/gold pads (surface mount pads which previously have not been soldered to a circuit board component but which are ready for soldering to a circuit board component) and a set of virgin nickel/gold plated-through holes. A typical virgin surface mount nickel/gold pad includes a layer of nickel which is approximately 200 to 250 micro-inches in thickness, and a top layer of gold which is approximately 6 micro-inches in thickness (e.g., 3 to 8 micro-inches). When circuit board components mount to the virgin pads, molten solder forms solderjoints between the pads and the leads (i.e., contacts) of the circuit board components. During the soldering process, the protective gold finish typically melts away (e.g., mixes with the solder) leaving solder to form intermetallic boundaries between the surface mount pads of the circuit board and the component leads.

Populated circuit boards, which include nickel/gold surface mount pads, occasionally suffer from "Black Pad" defects. A "Black Pad" defect is a flaw (e.g., a fracture) in an intermetallic boundary between a nickel surface mount pad and a lead of a circuit board component that results in an electrically unreliable connection between that nickel pad and that component lead. Such a defect often appears as a pressure-sensitive intermittent electrical connection between the device and the circuit board, i.e., between the nickel pad and the component lead. Studies have shown that "Black Pad" defects can be caused by excessive pad corrosion (i.e., oxidation of the nickel layer) prior to soldering. Such corrosion results in low solder-wettability (i.e., a low affinity for solder) thus providing a weak and unreliable solder joint after the soldering process.

Circuit board manufacturers can take a variety of approaches to handling "Black Pad" defects. One conventional approach involves the manufacturer inspecting each populated circuit board for "Black Pad" defects, and simply throwing away any circuit board having a "Black Pad" defect. Another conventional approach involves the manufacturer inspecting each populated circuit board for "Black Pad" defects, and reworking any circuit board having a "Black Pad" defect, i.e., unsoldering a circuit board component exhibiting symptoms of having a solder joint to a "Black Pad", cleaning the exposed surface mount pads, and soldering on a new circuit board component. Yet another conventional approach involves the fabrication manufacturer redesigning the board fabrication process to avoid using surface mount pads formed by nickel/gold immersion (e.g., redesigning the circuit board manufacturing process to use bare copper pads, silver pads, palladium pads, etc.).

SUMMARY OF THE INVENTION

Unfortunately, there are deficiencies to the above-described conventional approaches to avoiding "Black Pad" defects. For example, in the above-described conventional approach which involves throwing away populated circuit boards, a significant amount of added value is lost. In particular, some circuit boards may cost several thousands of dollars to make and it may be a significant drawback for a company to bear the burden of regularly writing-off such a cost.

Additionally, in the above-described conventional approach which involves reworking a populated circuit board having a "Black Pad" defect, the rework process does not consistently and effectively repair the intermittent connection caused by the "Black Pad" defect. That is, the intermittent connection is often formed by flaws in the intermetallic boundaries of the nickel layers of the metallic pads and, as such, is not fixed by simply replacing a circuit board component. To the contrary, a metallic pad suffering from a "Black Pad" defect typically has corrosion which extends below the pad surface (e.g., 20 micro-inches below the pad surface) as well as low solder-wetting ability (i.e., low affinity for solder) which does not improve when a new component lead is soldered to the pad. Accordingly, any new solder joint formed on the metallic pad is also likely to be unreliable and prone to failure.

Furthermore, in the above-described conventional approach which involves modifying the circuit board manufacturing process to use other types of pads (e.g., bare copper pads, silver pads, palladium pads), the alternative circuit board manufacturing processes can be more susceptible to other deficiencies which are not present in circuit boards using a nickel/gold immersion processes. For example, circuit boards, which use nickel/gold immersion where the nickel overplates the via copper and forms nickel eyelets, are well-suited to slowing down mechanical expansion of the circuit board in the Z-direction (i.e., circuit board expansion which is perpendicular to the circuit board plane) due to the clamping force provided by the nickel thus avoiding other circuit board drawbacks such as warping, fractures in metallic traces, separation of circuit board layers, etc. Eyelets formed of other metals have not inhibited circuit board expansion in the Z-direction as well as nickel eyelets. Accordingly, eliminating the nickel/gold eyelets and using other metallic eyelets (e.g., copper, silver, palladium, etc.) can provide poorer circuit board expansion results and thus promote other circuit board drawbacks.

The invention is directed toward techniques for manufacturing a circuit board having virgin metallic surface mount pads which involve removing a portion of each virgin metallic surface mount pad (e.g., removing several microinches from the tops of pads formed by a nickel immersion process). Accordingly, any corrosion or contaminants which collected within these removed portions are no longer available to promote "Black Pad" defects.

For example, phosphate compounds, which typically reside within nickel immersion baths to control nickel deposition rates, can become incorporated into the nickel immersion pads. In particular, such phosphate compounds can collect near the top surfaces of nickel immersion pads. Although these phosphate compounds in theory are supposed to provide metallic properties, these phosphate compounds may actually operate more like organic contaminants that interfere with formation of healthy solder joints (i.e., may lower solder-wettability of the pads). Removal of these contaminated top surfaces prior to the soldering process promotes formation of robust and healthy solder joints for thorough electrical and structural connectivity.

One embodiment of the invention is directed to a circuit board manufacturing system having a paste source, a circuit board processing apparatus coupled to the paste source, and a controller coupled to the circuit board processing apparatus. The circuit board processing apparatus includes a carrier which is configured to receive a circuit board having (i) a section of circuit board material and (ii) virgin metallic surface mount pads (e.g., pads formed by a nickel immersion process) which are supported by the section of circuit board material. The circuit board processing apparatus further includes a paste distribution assembly (e.g., a manifold and set of nozzles) coupled to the carrier and to the paste source. The paste distribution assembly is configured to dispose a paste (e.g., a compound including carbohydroxilate flux and an abrasive material) from the paste source onto a surface of the circuit board. The carrier further includes a surfacing assembly coupled to the carrier. The surfacing assembly is configured to move the paste over the surface of the circuit board to remove a portion of each virgin metallic surface mount pad. The controller (e.g., an electronic control device, a computer, etc.) is configured to selectively start and stop operations of the paste distribution and surfacing assemblies.

It should be understood that movement of the paste over the metallic pads enables removal of a portion of each pad in a chemical and physical manner. That is, flux within the paste reacts with the metal in each pad. At the same time, movement of the paste (e.g., movement of abrasive material within the paste over the pads) exposes additional surfaces of the pads for reaction with the flux (e.g., a flux loosely based on a Carbon flux chemistry).

In one arrangement, the paste includes non-flammable carbohydroxilate flux and abrasive material. In this arrangement, the surfacing assembly includes a roller having fiber-reinforced polyester material, and a positioning member which is configured to position and operate the roller over the paste and the surface of the circuit board. In one arrangement, the roller removes the portions of the pads in a lapping manner (e.g., gradually by polishing material off of the top surface of the pads). In one arrangement, the non-flammable carbohydroxilate flux provides both lubrication and heat control between the roller and the surface of the circuit board. The above-described lapping operation is essentially self-limiting since the flux reacts only with the exposed surfaces of the pads (i.e., the amount of each pad which is removed is greater than the oxide thickness or contamination thickness, but not so much that the pad becomes no longer useful for mounting to circuit board component contacts).

In one arrangement, the circuit board processing apparatus further includes a heater which is configured to heat the paste to a temperature of at least 150 degrees Fahrenheit (e.g., substantially to 160 degrees Fahrenheit). This application of heat facilitates chemical reaction between the flux within the paste and the virgin metallic surface mount pads.

In one arrangement, the positioning member applies the roller to the paste and the surface of the circuit board in an even manner such that, after the portion of each virgin metallic surface mount pad is removed, the virgin metallic surface mount pads have substantially the same height. Accordingly, circuit board components (e.g., BGA devices) can sit over the pads in a uniform and stable manner thus avoiding gaps or unnecessarily long solder joints between particular pads and component leads.

In some arrangements, the circuit board manufacturing system processes both sides of the circuit board simultaneously. For example, in one arrangement, the paste distribution assembly includes a first paste dispenser (e.g., a first set of nozzles) which is configured to dispense the paste on a first side of the circuit board, and a second paste dispenser (e.g., a second set of nozzles) which is configured to dispense paste on a second side of the circuit board which is opposite the first side. In this arrangement, the surfacing assembly includes a first set of rollers which is configured to move the paste and the first side of the circuit board, and a second set of rollers which is configured to move the paste and the second side of the circuit board. The first and second sets of rollers can be configured to apply even pressure for uniform processing of both sides of the circuit board at substantially the same time.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed toward techniques for manufacturing a circuit board having virgin metallic surface mount pads, i.e., surface mount pads which previously have not been soldered to a circuit board component but which are ready for soldering to such a component. The techniques involve removing a portion of each pad, e.g., removing several micro-inches from the tops of pads formed by a nickel immersion process. As a result, any corrosion or contaminants which collected within these removed pad portions are no longer available to create "Black Pad" defects. For example, phosphate compounds which can collect near the top surfaces of nickel immersion pads and which in theory are supposed to provide metallic properties, may actually operate more like organic contaminants that interfere with formation of healthy solder joints (e.g., may lower solder-wettability of the pads). Removal of these contaminated top surfaces prior to the soldering process facilitates formation of robust and healthy solder joints for thorough electrical and structural connectivity.

Figure 1:
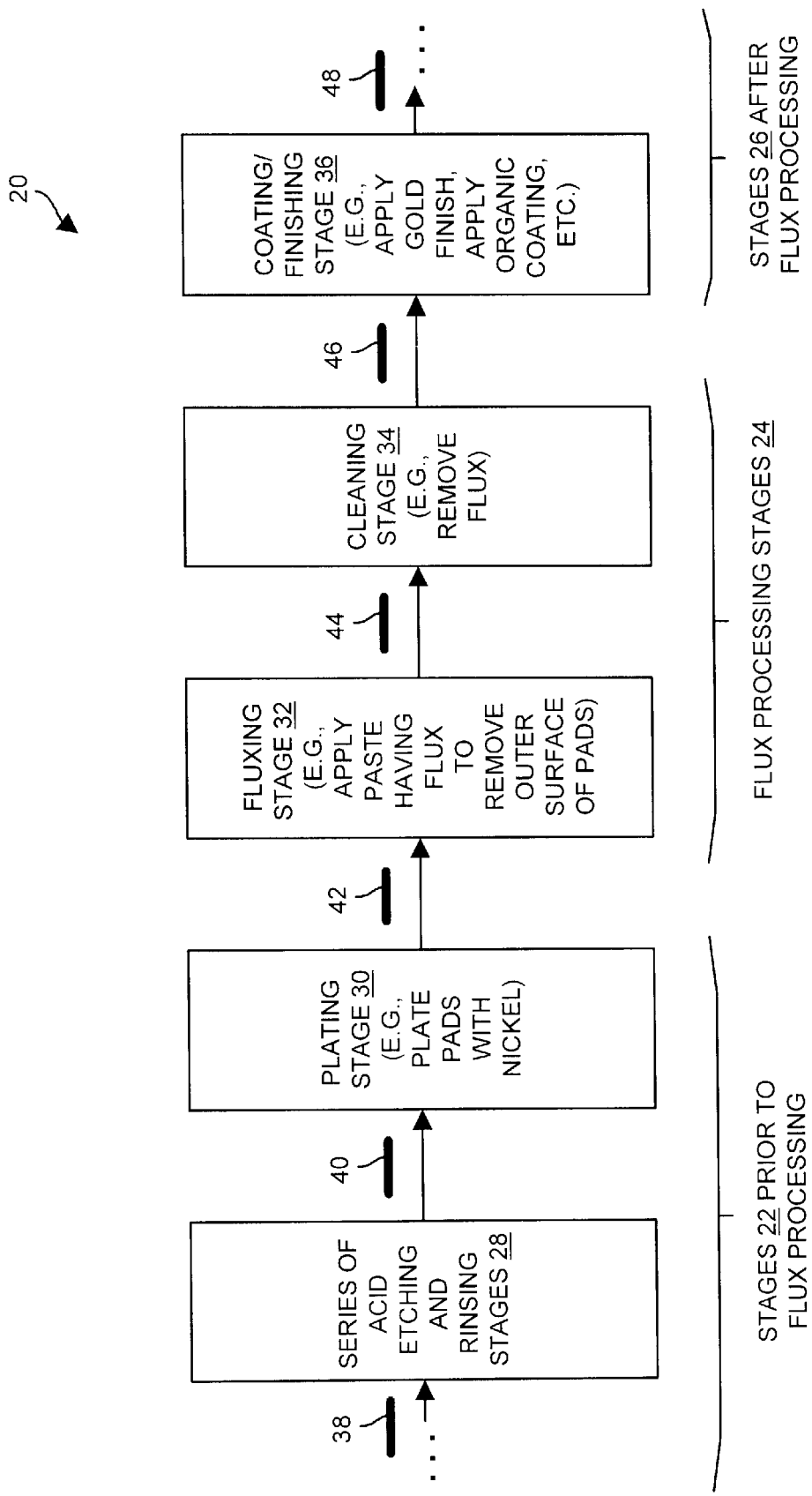
FIG. 1 is a block diagram of a circuit board manufacturing system which is suitable for use by the invention.

FIG. 1 shows a circuit board manufacturing system 20 which is suitable for use by the invention. The circuit board manufacturing system 20 includes a series of stages which are configured in a pipelined or conveyor-belt-like manner. In particular, the system 20 includes an initial set of stages 22, a set of flux processing stages 24, and a subsequent set of stages 26. As shown in FIG. 1, the initial set of stages 22 includes, among other things, a series of acid etching and rinsing stages 28 and a plating stage 30. The set of flux processing stages 24 includes a fluxing stage 32 and a cleaning stage 34. The subsequent set of stages 36 includes, among other things, a coating/finishing stage 36.

The series of acid etching and rinsing stages 28 (i) receives a partially formed circuit board structure 38, (ii) acid etches circuit board features (e.g., metallic traces, identification markings, etc.) on the outer surface of the circuit board structure 38 and (iii) rinses away the acid, to provide a circuit board structure 40 which is ready to receive metallic plating. It should be understood that other circuit board manufacturing stages (not shown for simplicity) precede the series of acid etching and rinsing stages 28 (e.g., a stage which forms individual circuit board layers, a stage which glues the layers together to form an aggregate structure, a stage which cuts and drills the aggregate structure to produce the partially formed circuit board structure 38, etc.).

The plating stage 30 applies metal to the circuit board structure 40 to form a circuit board 42 having a section of circuit board material and virgin metallic surface mount pads supported by the section of circuit board material. In one arrangement, the plating stage 30 includes a nickel immersion process which applies ionic nickel to copper pads of the circuit board structure 40 in a substantially voltage-less environment to form the virgin metallic surface mount pads. In one arrangement, the plating stage 30 forms additional nickel structures such as nickel plated-through holes and nickel eyelets. Such plated-through holes and eyelets provide reinforcement and cohesion between circuit board layers to limit expansion of the circuit board 42 in the Z-direction (e.g., in the direction perpendicular to the plane of the circuit board 42).

The fluxing stage 32 disposes a paste onto the surface of the circuit board 42, and moves the paste over the surface of the circuit board 42. As will be explained in further detail later, in one arrangement, the paste is mechanically thixotropic and includes flux and an abrasive material, and perhaps other material (e.g., a binder). Accordingly, as the paste spreads over the surface of the circuit board 42, movement of the paste removes a portion of each virgin metallic surface mount pad. In particular, the flux within the paste chemically reacts with the nickel within the pads, and the abrasive material physically exposes additional surface area of the pads so that the top surface of each pad, which can include corrosion and contaminants that could otherwise lead to a "Black Pad" defect, is removed. Accordingly, each pad is metallurgically cleaned. The end result is a circuit board 44 having virgin metallic surface mount pads with little or no susceptibility to "Black Pad" defects. Further details of how this is accomplished will be provided later.

The cleaning stage 34 removes the paste and the reacted material from the circuit board 44. In particular, the cleaning stage 34 wipes (e.g., squeegees) the paste and the reacted material from the circuit board 44 and then rinses away any remaining residue (e.g., paste embedded within drilled holes) to provide a cleaned (e.g., ionically cleaned) circuit board 46 having virgin metallic surface mount pads with little or no susceptibility to "Black Pad" defects.

The coating/finishing stage 36 provides a protective covering to the circuit board 46. In one arrangement, the coating/finishing stage 36 applies a noble metal finish to the exposed metallic features of the circuit board 36. For example, the coating/finishing stage 36 can apply a gold finish to the virgin metallic surface mount pads, any plated-through holes and any eyelets using a gold immersion process. In another arrangement, the coating/finishing stage 36 applies an organic coating to the outer surface of the circuit board 36. In these arrangements, the resulting circuit board 48 is sealed to prevent oxidation of the underlying metal (e.g., nickel) and enables the circuit board 48 to be stored for an extended amount of time (e.g., several weeks) prior to being populated with circuit board components. The sealant (e.g., the immersion gold, the organic coating, etc.) can be remove directly by a subsequent processing stage (e.g., washed off), or indirectly during the subsequent processing stage (e.g., melted off during component soldering). Further details of the invention will now be provided with reference to FIG. 2.

Figure 2:
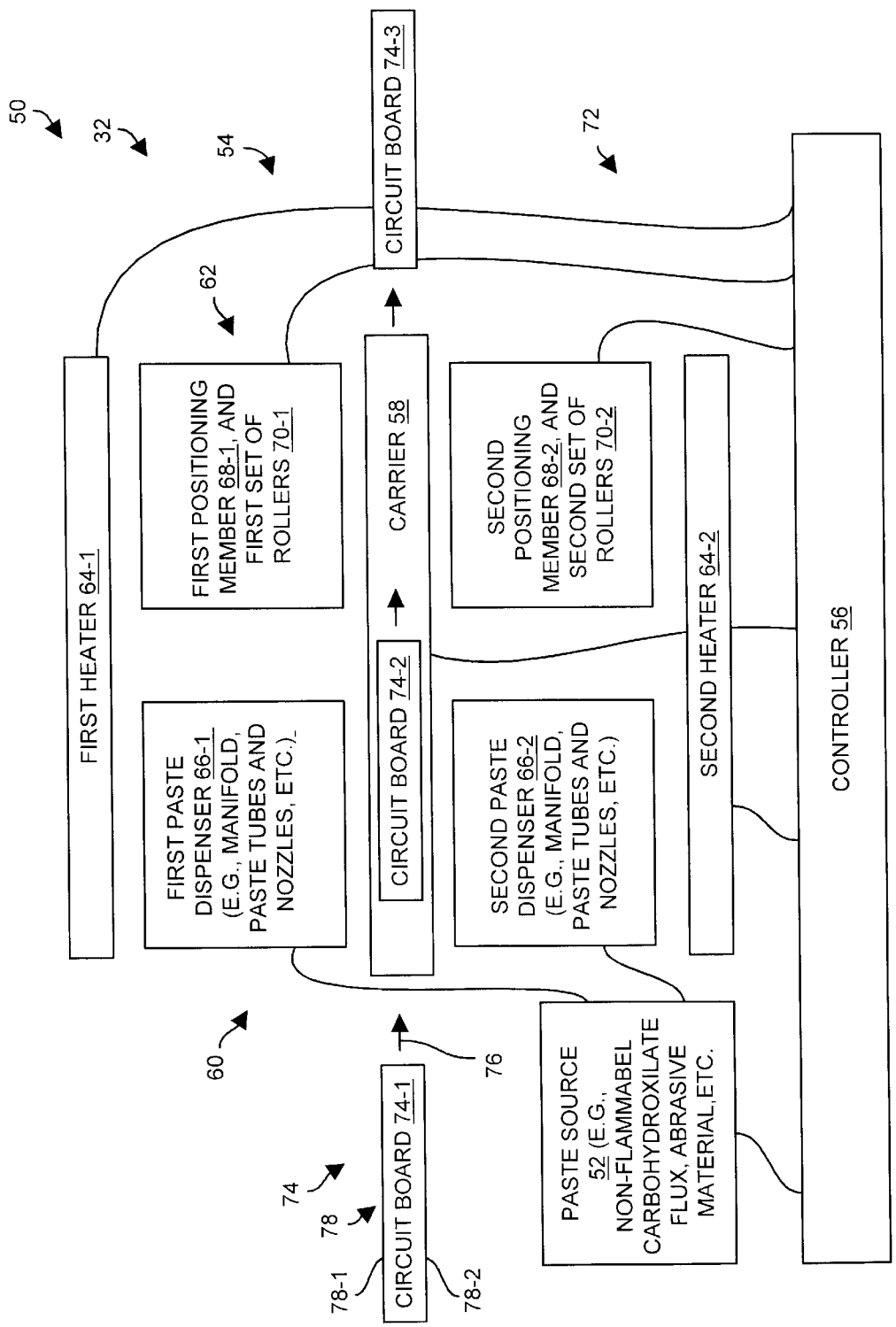
FIG. 2 is a block diagram of a processing stage of the circuit board manufacturing system of FIG. 1.

FIG. 2 is a block diagram 50 of the fluxing stage 32 of the circuit board manufacturing system 20. As shown, the fluxing stage 32 includes a paste source 52, a circuit board processing apparatus 54 and a controller 56. The circuit board processing apparatus 54 includes a carrier 58, a paste distribution assembly 60, a surfacing assembly 62, and a set of heaters 64-1, 64-2 (collectively, heaters 64). The paste distribution assembly 60 includes a first paste dispenser 66-1 and a second paste dispenser 66-2. The surfacing assembly 62 includes a first positioning member 68-1, a first set of rollers 70-1 (e.g., rotary pinch rollers), a second positioning member 68-2, and a second set of rollers 70-2. The fluxing stage 32 further includes a set of connections 72 that enables the controller 56 to control the operation of particular components such as the paste source 52, the carrier 58, the heaters 64-1, 64-2, the paste dispensers 66-1, 66-2, and the positioning members 68-1, 68-2.

During operation, the fluxing stage 32 processes circuit boards 74 (e.g., circuit boards 74-1, 74-2 and 74-3 in FIG. 2) in a conveyor-belt-like manner. That is, the carrier 58 receives circuit boards 74 having sections of circuit board material and virgin metallic surface mount pads (also see the circuit board 42 of FIG. 1), and moves the circuit boards 74 past various components of the fluxing stage 32 in a direction 76 for processing (i.e., past the paste distribution assembly 60, the surfacing assembly 62, and the set of heaters 64-1, 64-2). As a result, the circuit boards 74 exiting the fluxing stage 32 have metallurgically cleaned virgin metallic surface mount pads which have little or no susceptibility to "Black Pad" defects (see the circuit board 44 of FIG. 2).

As the carrier 58 moves each circuit board 74 past the paste distribution assembly 60, the paste dispensers 66-1, 66-2 distribute paste over a surface 78 of that circuit board 74. In particular, the first paste dispenser 66-1 distributes paste over a first side 78-1 of the circuit board 74, and the second paste dispenser 66-2 distributes paste over a second side 78-2 of the circuit board 74.

Additionally, as the carrier 58 moves each circuit board 74 past the surfacing assembly 62, the surfacing assembly 62 moves the dispensed paste over the surface 78 of that circuit board 74 to remove a portion of each virgin metallic surface mount pad. In particular, the first positioning member 68-1 applies the first set of rollers 70-1 to the first side 78-1 of the circuit board 74, and the second positioning member 68-2 applies the second set of rollers 70-2 to the second side 78-2 of the circuit board 74. In one arrangement, the sets of rollers 70-1, 70-2 maneuver the paste over the circuit board surface 78 in a lapping manner. In this arrangement, the sets of rollers 70-1, 70-2 turn at a relatively slow rate in order to avoid creating too much friction which could overheat the circuit board surface 78. When applying the sets of rollers 70-1, 70-2, the positioning members 68-1, 68-2 adjust to the proper distances away from the circuit board surface 78 (e.g., gauge the circuit board's thickness) in order to apply a proper amount of pressure or force and thus remove a precise and consistent amount of top surface from each pad 82. This above-described lapping mechanism is essentially self-limiting since the flux reacts only with the exposed surfaces of the pads 82 (i.e., the amount of each pad 82 which is removed is greater than the oxide thickness or contamination thickness, but not so much that the pad 82 becomes no longer useful for mounting to circuit board component contacts).

In one arrangement, the paste is slurry-like in form, and includes non-flammable carbohydroxilate flux and abrasive material. The non-flammable carbohydroxilate flux is configured to chemically react with the virgin metallic surface mount pads in order to remove oxidized and contaminated portions of the pads near their surface. The abrasive material, when moving over the pads, is configured to mildly abrade the tops of the pads to expose the pad surfaces to the flux. Although there is inevitably some friction caused by the movement of the abrasive material over the pads, the non-flammable carbohydroxilate flux tends to provide lubrication and heat control thus preventing the circuit board surface 78 from sustaining damage due to too much heat. For example, without such lubrication and heat control, it is possible that the surfaces 78 of the circuit boards 74 could reach such a high temperature that the virgin metallic surface mount pads would react in an undesirable manner with contaminants (e.g., oxidize to promote "Black Pad" defects). Accordingly, the fluxing stage 32 operates such that the circuit board surfaces 78 remains substantially in a temperature range that promotes flux reaction with the pads, but that is lower than temperatures that promote excessive reaction between the pads and contaminants.

It should be understood that the non-flammable attribute (e.g., not Class A flammable) of the flux alleviates concern that the circuit boards 74 could inadvertently burn or catch fire while being processed by the fluxing stage 32. To the contrary, when the paste is moved over the circuit boards 74, the flux provides heat control by absorbing and dissipating, or distributing, heat due to friction. In one arrangement, the paste includes a binder/solvent that is not Class A or Class B flammable near the operating temperate (e.g., 160 degrees Fahrenheit). Rather, in this arrangement, the binder/solvent is lubricious while simultaneously being configured to substantially hold the flux and the abrasive material in suspension. Examples of some suitable binders/solvents include organic oils, synthetic oils, and the like.

In one arrangement, the heaters 64-1, 64-2 raise the operating temperature of the fluxing stage 32 to a steady temperature which facilitates chemical reaction between the flux and the pads (e.g., a substantially consistent 160 degrees Fahrenheit +/−10%). The application of heat to maintain this steady temperature tends to provide dependable and uniform results, e.g., consistent results from pad to pad on each circuit board 74, and consistent results from circuit board 74 to circuit board 74.

It should be understood that the controller 56 (e.g., an electronic controller device, a computer, etc.) enables a user to control particular operating parameters of the fluxing stage 32. In particular, the user can operate an input/output (I/O) device of the controller 56 to enable paste delivery or disable paste delivery by the paste source 52 through the set of connections 72. Additionally, the user can operate the controller 56 to start, stop or vary the rate at which the carrier 58 moves circuit boards 74 past the paste distribution and surfacing assemblies 60, 62 (through the set of connections 72). Furthermore, the user can operate the controller 56 to start, stop or vary the operating speeds of the surfacing assembly 62 (e.g., the rotation rates of the sets of rollers 68-1, 68-2). Also, the user can operate the controller 56 to activate, deactivate, or control the amount of heat provided by the heaters 64-1, 64-2. Further details of the invention will now be provided with reference to FIG. 3.

Figure 3:
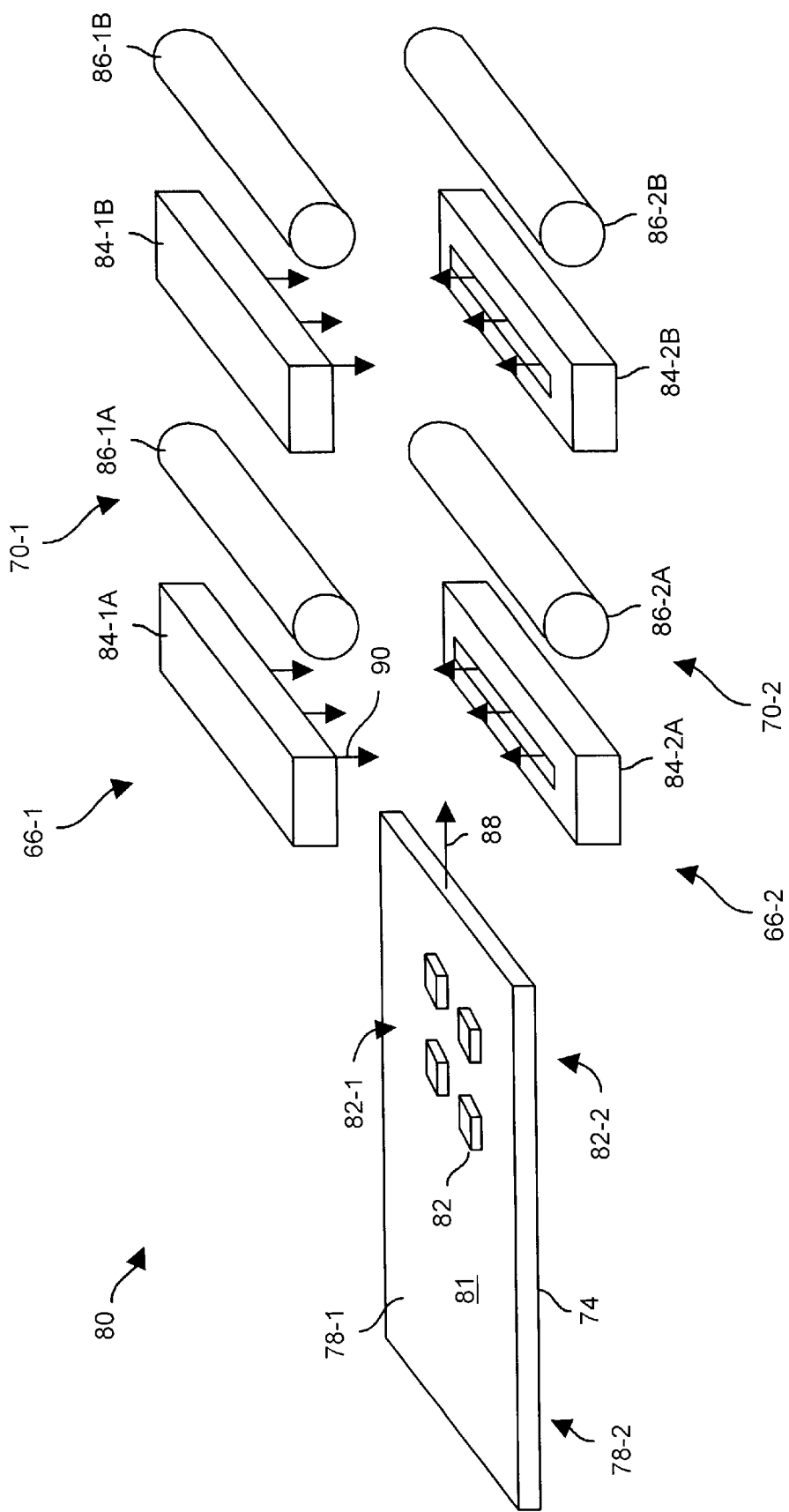
FIG. 3 is a perspective view of particular components of the processing stage of FIG. 2 when processing a circuit board.

FIG. 3 is a perspective view 80 of particular components of the fluxing stage 32 of FIGS. 1 and 2 when processing a circuit board 74. As shown in FIG. 3, the circuit board 74 includes a section of circuit board material 81 and virgin metallic surface mount pads 82 (e.g., SMT pads for mounting a BGA device) residing on the surface 78 of the section of circuit board material 81. In particular, the circuit board 74 includes a first set of pads 82-1 residing on the circuit board surface 78-1, and a second set of pads 82-2 residing on the circuit board surface 78-2.

As further shown in FIG. 3 and by way of example only, the first paste dispenser 66-1 includes multiple paste dispensing members 84-1A, 84-1B, and the second paste dispenser 66-2 includes multiple paste dispensing members 84-2A, 84-2B. Similarly, the first set of rollers 70-1 includes multiple rollers 86-1A, 86-1B, and the second set of rollers 70-2 includes multiple rollers 86-2A, 86-2B. The paste dispensing members 84-1A, 84-1B and the rollers 86-1A, 86-1B are oriented to treat the first side 78-1 of the circuit board 74, and the paste dispensing members 84-2A, 84-2B and the rollers 86-2A, 86-2B are oriented to treat the second side 78-2 of the circuit board 74 as the circuit board 74 moves in the direction 88 (in response to operation of the carrier 58, also see the direction 76 in FIG. 2).

In one arrangement which is shown in FIG. 3, the circuit board 74 has a horizontal orientation (i.e., the plane of the circuit board 74 is substantially horizontal) as the circuit board 74 passes by the paste dispensing members 66-1, 66-2 and the rollers 70-1, 70-2. As such, the paste dispensing members 84-1A, 84-1B dispense the paste in a substantially downward direction 90 onto the first side 78-1 of the circuit board 74, while the paste dispensing members 84-2A, 84-2B dispense the paste in a substantially upward direction, which is opposite the direction 90, onto the second side 78-2 of the circuit board 74. Further details of the invention will now be provided with reference to FIG. 4.

Figure 4:
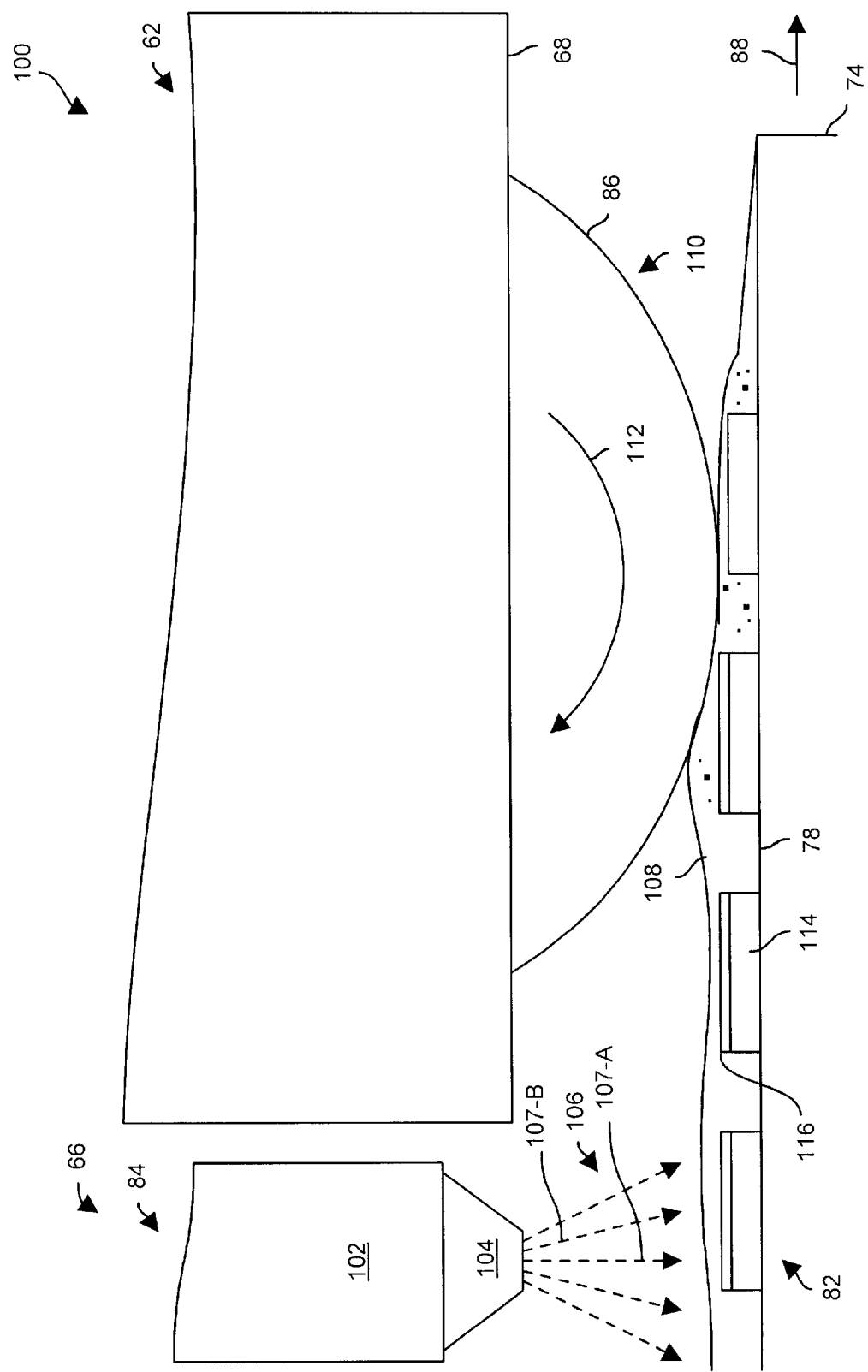
FIG. 4 is a detailed side view of particular components of the processing stage of FIG. 2 when processing the circuit board.

FIG. 4 shows a detailed side view 100 of particular components of the fluxing stage 32 of FIGS. 1 through 3 when processing a portion of a circuit board 74. As shown, the side view 100 includes a paste dispensing member 84 of a paste distribution dispenser 66 (also see FIG. 3), as well as a positioning member 68 and a roller 86 of the surfacing assembly 62 (also see FIG. 3).

The paste dispensing member 84 includes a manifold section 102 (e.g., a metallic or plastic channeled or tubed member) and a nozzle 104 which connects the to the manifold section 102. The nozzle 104 dispenses (e.g., sprays) paste 106 from the paste source 52 (FIG. 2) onto the circuit board surface 78. For illustration purposes, the flux within the paste 106 is shown as a dashed line 107-A, and abrasive material within the paste 106 is shown as a dashed line 107-B. However, it should be understood that the flux 107-A and the abrasive material 107-B can be thoroughly and evenly mixed prior to ejection from the nozzle 104. In one arrangement, the nozzle 104 applies the paste 106 under relatively low pressure (e.g., an even flow) to avoid splattering and deflection off of circuit board structures (e.g., pads), and to conserve the paste 106. In another arrangement, the nozzle 104 applies the paste 106 under relatively high pressure to improve contact with the circuit board surface 78. In one arrangement, the paste 106 collects and forms a thin gel-like (or thixotropic) paste layer 108 on the surface 78 of the circuit board 74.

As the circuit board 74 passes by the paste dispensing member 84 and the surfacing assembly 62 in the direction 88, the roller 86 rotates to move the layer 108 of paste 106 against the pads 82 in a lapping manner. In one arrangement, the roller 86 includes fiber-reinforced polyester material 110 (e.g., a fiber-reinforced polyester surface) which polishes or rubs the paste 106 over the pads 82. By way of example only, the roller 86 rotates in a clockwise direction 112 against the direction 88 of movement of the circuit board 74.

As the surfacing assembly 62 moves the paste 106 over the surface 78 of the circuit board 74, the flux within the paste 106 chemically reacts with the virgin metallic surface mount pads 82 (as well as other circuit board features such as plated-through holes and eyelets). As a result of such reaction, a major underlying portion 114 of each pad 82 remains, but a small top portion 116 of each pad 82 comes off. Accordingly, any contaminants residing in the top portions 116 which could have otherwise contributed to a "Black Pad" defect is removed. For example, such operation can remove phosphate derivatives which can collect near the top surfaces of nickel immersion pads and which in theory are supposed to provide metallic properties, but actually operate more like organic contaminants that interfere with formation of healthy solderjoints (i.e., may lower solder-wettability of the pads). Removal of these contaminants prior to the component soldering process promotes formation of robust and healthy solder joints for thorough electrical and structural connectivity. A summary of how the fluxing stage 32 of the circuit board manufacturing system 20 operates will now be provided with reference to FIG. 5.

Figure 5:
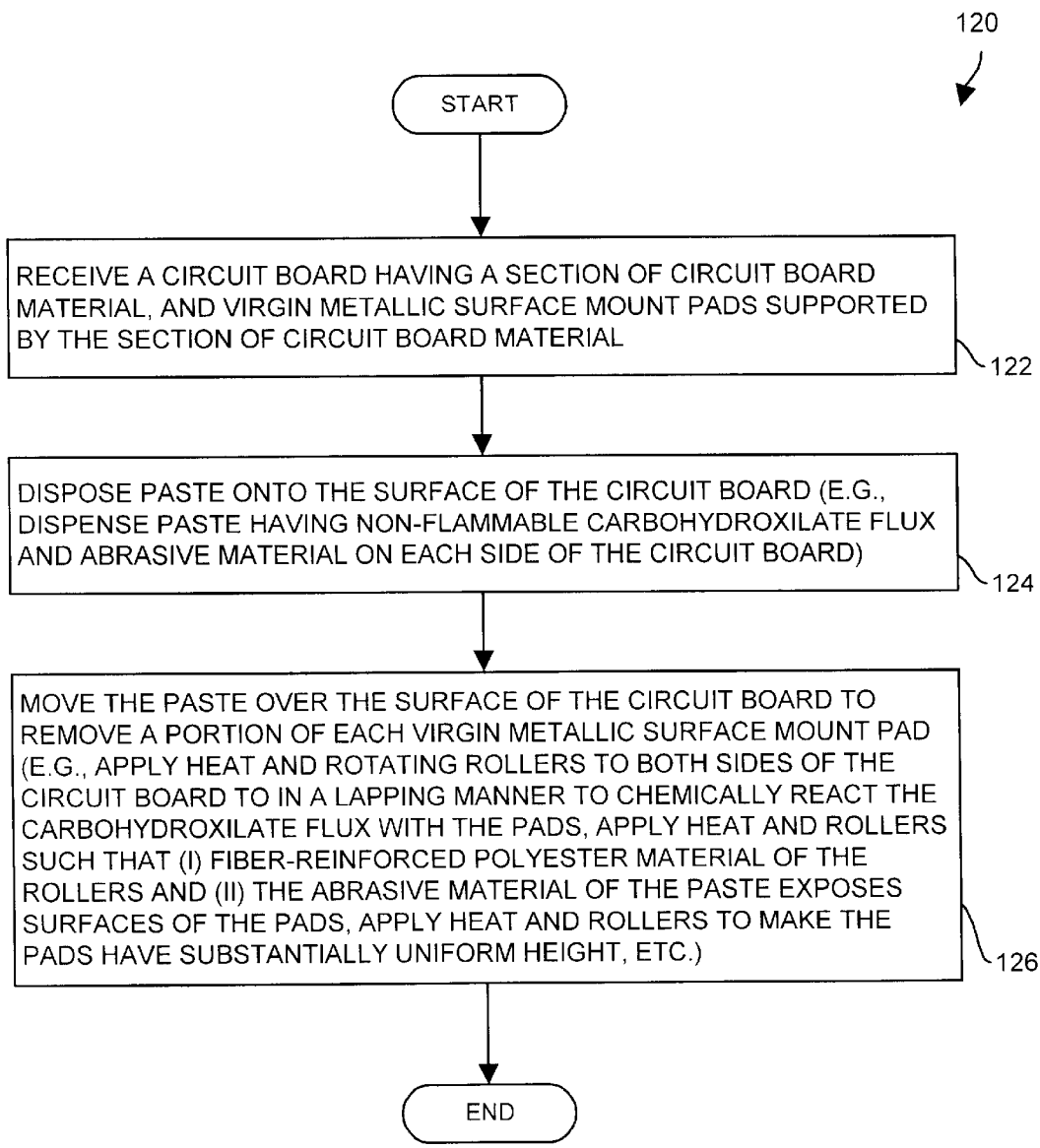
FIG. 5 is a flowchart of a procedure which is performed by the processing stage of FIG. 2.

FIG. 5 is a flowchart of a procedure 120 which is performed by the fluxing stage 32 of the circuit board manufacturing system 20 (FIG. 1). In step 122, the fluxing stage 32 receives a circuit board 74 having a section of circuit board material 81 and virgin metallic surface mount pads 82 supported by the section of circuit board material 81. The virgin metallic surface mount pads 82 have never been soldered to a circuit board component and thus do not have any solder layer, or solder flux contaminants residing on their surfaces. Rather, the virgin metallic surface mount pads 82 include fresh, newly formed metal which was added by the plating stage 30. In one arrangement, the plating stage 30 is a nickel immersion processing stage, and the pads 82 include fresh nickel applied from a voltage-less ionic nickel bath.

In step 124, the fluxing stage 32 disposes paste 106 (e.g., a slurry including non-flammable carbohydroxilate flux and abrasive material) onto the surface 78 of the circuit board 74. In one arrangement, the fluxing stage 32 simultaneously applies the paste 106 to both sides 78-1, 78-2 of the circuit board 74 (FIGS. 2 and 3).

In step 126, the fluxing stage 32 moves the paste 106 over the surface 78 of the circuit board 74 to remove a portion 116 of each virgin metallic surface mount pad 82. In one arrangement, the surfacing assembly 62 simultaneously applies sets 70-1, 70-2 of rollers 86 to the sides 78-1, 78-2 of the circuit board 74 in a lapping or polishing manner. The heaters 64-1, 64-2 of the fluxing stage 32 (FIG. 2) provide heat to bring the temperature of the pads 82 and the paste 106 substantially into a temperature range (e.g., 160 degrees Fahrenheit +/−10%) which promotes chemical reaction between the flux and the pads 82 but does not promote excessive metal oxidation of the pads 82. Accordingly, the flux within the paste 106 provides both chemical cleaning action plus lubrication and heat control. Additionally, the abrasive material within the paste moves against the tops of the pads 82 to expose new pad surfaces for reaction with the flux. As a result, the fluxing stage 32 effectively and efficiently removes a top portion 116 of each virgin metallic surface mount pad 82 as well as any corroded or contaminated portions which could contribute to a "Black Pad" defect. By removing the tops of the pads 82 in this manner, the fluxing stage 32 can mechanically modify the surfaces of the pads 82 without friction thus avoiding the possibility of damaging the surface metallurgically, chemically or mechanically (e.g., by causing the metal in the pads 82 to react with contaminants, oxidized, etc.).

As described above, the invention is directed toward techniques for manufacturing a circuit board 74 having virgin metallic surface mount pads 82, i.e., surface mount pads which previously have not been soldered to a circuit board component but which are ready for soldering to such a component. The techniques involve removing a portion 116 of each pad 82, e.g., removing several micro-inches from the tops of pads 82 formed by a nickel immersion process. As a result, any corrosion or contaminants which collected in these removed pad portions are no longer available to create "Black Pad" defects. For example, the invention is suitable for removing phosphate compounds which can collect near the top surfaces of nickel immersion pads and which in theory are supposed to provide metallic properties, but which could actually operate more like organic contaminants that interfere with formation of healthy solder joints (i.e., may lower solder-wettability of the pads). Removal of these contaminated pad portions 116 prior to the soldering process facilitates formation of robust and healthy solder joints for thorough electrical and structural connectivity.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the fluxing stage 32 was described above as applying rollers 86 which rotate on axes that are substantially parallel to the plane of the circuit board 74 (FIGS. 3 and 4) and thus provide a roller surface (e.g., a fiber-reinforced polyester surface) which moves substantially along the plane of the circuit board 74 by way of example only (e.g., against the direction 88 of movement of the circuit board 74, with the direction 88 of movement of the circuit board 74, substantially perpendicular to the direction 88 of movement of the circuit board 74, substantially diagonally to the direction 88 of movement of the circuit board 74, etc.). In other arrangements, the rollers 86 do not rotate on axes which are substantially parallel to the plane of the circuit board 74.

Figure 6:
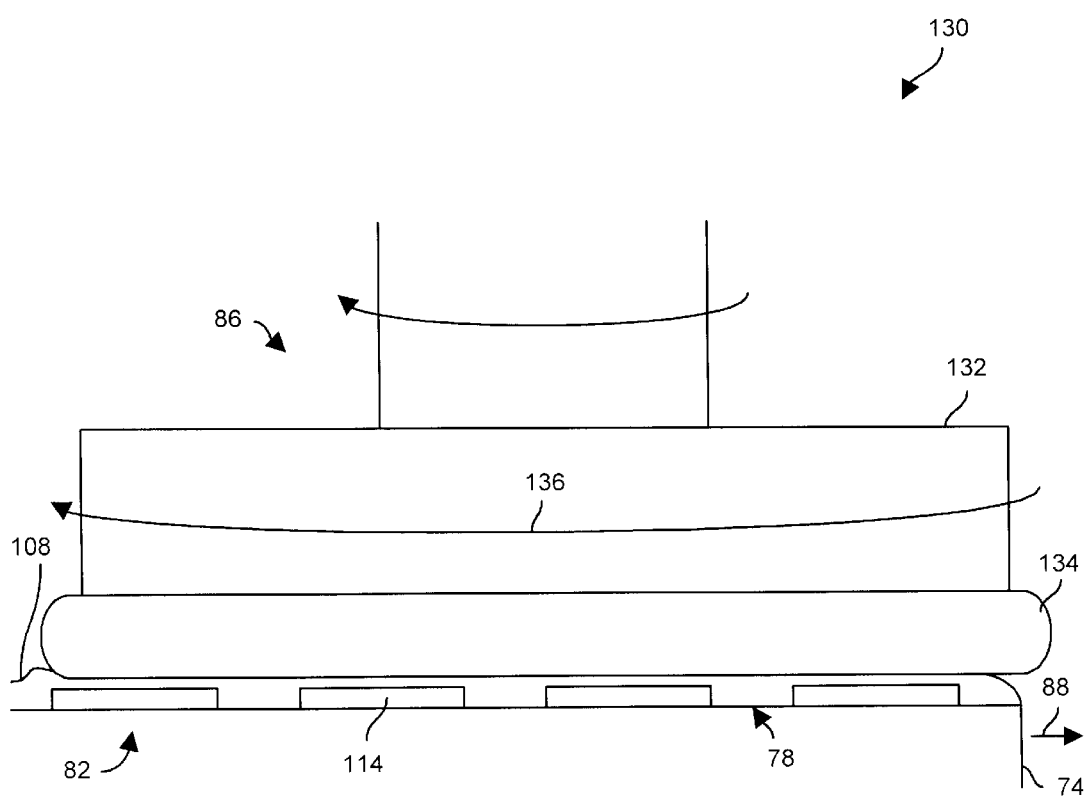
FIG. 6 is a detailed side view of particular components of the processing stage of FIG. 2 which are suitable alternatives to that of FIG. 4.

FIG. 6 shows a roller arrangement 130 which is alternative to that of FIG. 4. In the arrangement 130, the roller 86 rotates about an axis which is substantially perpendicular to the plane of the circuit board 74, i.e., rotates-about the Z-axis. In this arrangement, the roller 86 includes a support member 132 (e.g., a shaft member and mount member at the end of the shaft member) and a surfacing member 134 (e.g., fiber-reinforced material) which is supported and moved by the support member 132, and which contacts and moves the paste layer 108 relative to the circuit board surface 78. The roller 86 of FIG. 6 rotates about the substantially perpendicular axis in a circular direction shown by the arrow 136 in order to move the paste layer 108 and thus remove the tops of the pads 82. In other arrangements, the axis of rotation of the roller 86 is not substantially perpendicular or substantially parallel to the plane of the circuit board 74 such that only an edge of the surfacing member 134 contacts the paste layer 108 and the circuit board surface 78 (e.g., an edge moving in the direction opposite the direction 88 of the circuit board 74, the direction 88 of the circuit board 74, etc.). In one arrangement, the fluxing stage 32 includes rollers 86 which rotate at different axes to provide different motions (e.g., to provide special treatment to particular locations of the circuit boards 74, to provide a combination different lapping motions for more thorough processing, etc.)

Additionally, it should be understood that the material of the rollers 86 which moves the paste 106 was described above as being fiber-reinforced polyester by way of example only. In other arrangements, the material is not fiber-reinforced polyester but material which provides a similar texture (e.g., grit value) and behavior (e.g., similar mechanical hardness, purity, etc.). In another arrangement, the rollers 86 include a brush-like surfaces.

Furthermore, it should be understood that the fluxing stage 32 was described above as simultaneously treating two sides 78-1, 78-2 of each circuit board 74 by way of example only. In other arrangements, the fluxing stage 32 does not treat both sides 78-1, 78-2 simultaneously (e.g., treats only one circuit board side at a time, treats one side only, etc.).

Additionally, it should be understood that the fluxing stage 32 was described above as processing circuit boards 74 when the circuit boards 74 have a substantially horizontal orientation by way of example only (FIG. 3). In other arrangements, the fluxing stage 32 processes circuit boards 74 having a different orientation. For example, in one arrangement, the fluxing stage 32 processes circuit boards 74 having a substantially vertical orientation in order to permit excess paste 106 and debris to fall off the circuit board sides 78-1, 78-2, and thus permit the fluxing stage 32 to apply new fresh paste 106 to the circuit board sides 78-1, 78-2.

Furthermore, it should be understood that the paste dispensing members 84 and the rollers 86 were described above (also see FIG. 3) as being interleaved with each other by way of example only. In other arrangements, the paste dispensing members 84 and the rollers 86 are not interleaved. For example, in other arrangements, the paste dispensing members 84 are disposed ahead of the rollers 86 in order to thoroughly apply paste 106 before the rollers 86 move the paste over the surface 78 of the circuit boards 74.

Additionally, it should be understood that the fluxing stage 32 was described above as including two rollers 86 for treating the first side 78-1 of the circuit board 74, and two rollers 86 for treating the second side 78-2 of the circuit board 74. In other arrangements, there are a different number of rollers 86 for each side 74 (e.g., 1, 3, 4, 5, etc.). Moreover, the sizes and shapes of the rollers 86 can be customized to accommodate different circuit board shapes and sizes (e.g., the rollers 86 of FIG. 3 can be made slightly wider than the circuit board 74, the rollers 86 of FIG. 6 can be smaller than the width of the circuit board 74 but staggered for uniform and complete treatment of the circuit board surface 78, etc.).

Furthermore, it should be understood that the paste 106 was described above as including non-flammable Carbohydroxilate flux and abrasive material, and as having thixotropic characteristics by way of example only. In other arrangements, the paste 106 has different attributes such as a slushier behavior (e.g., lower viscosity for improved lubrication and heat control and for reducing the likelihood of building up and impregnating on the circuit board surface 78).

Additionally, it should be understood that the pads 82 were described above as being suitable for soldering to BGA components by way of example only. The techniques of the invention are well suited for processing other types of pads and structures, e.g., Chip-Scale Packaging (CSP) devices, Flip Chip devices and Multi-chip modules (MCMs), and so on.

Furthermore, it should be understood that the paste 106 was described above as including carbohydroxilate flux by way of example only. In other arrangements, the paste includes other fluxing materials such as abietic acid, other resin acids, organic acids and/or inorganic acids. Such modifications and enhancements are intended to belong to particular embodiments of the invention.

What is claimed is:

1. A circuit board manufacturing system, comprising
   a paste source;
   a circuit board processing apparatus having:
      a carrier which is configured to receive a circuit board having (i) a section of circuit board material, and (ii) virgin metallic surface mount pads supported by the section of circuit board material,
      a paste distribution assembly coupled to the carrier and to the paste source, the paste distribution assembly being configured to dispose a paste from the paste source onto a surface of the circuit board, and
      a surfacing assembly coupled to the carrier, the surfacing assembly being configured to move the paste over the surface of the circuit board to remove a portion of each virgin metallic surface mount pad; and
   a controller coupled to the circuit board processing apparatus, the controller being configured to selectively start and stop operation of the paste distribution assembly, and selectively start and stop operation of the surfacing assembly.

2. A circuit board processing apparatus, comprising:
   a carrier which is configured to receive a circuit board having (i) a section of circuit board material, and (ii) virgin metallic surface mount pads supported by the section of circuit board material;
   a paste distribution assembly coupled to the carrier, the paste distribution assembly being configured to dispose a paste onto a surface of the circuit board; and
   a surfacing assembly coupled to the carrier, the surfacing assembly being configured to move the paste over the surface of the circuit board to remove a portion of each virgin metallic surface mount pad.

3. The circuit board processing apparatus of claim 2 wherein the paste includes carbohydroxilate flux, and wherein the surfacing assembly includes:
   a movable member which, when in operation, is configured to work the paste over the virgin metallic surface mount pads of the circuit board in a lapping manner to chemically react the carbohydroxilate flux with the virgin metallic surface mount pads.

4. The circuit board processing apparatus of claim 2 wherein the paste includes abrasive material and flux, and wherein the surfacing assembly includes:
   a movable member which, when in operation, is configured to work the paste over the virgin metallic surface mount pads of the circuit board in a lapping manner such that movement of the abrasive material over the virgin metallic surface mount pads exposes surfaces of the virgin metallic surface mount pads to the flux.

5. The circuit board processing apparatus of claim 2 wherein the paste includes non-flammable flux, and wherein the surfacing assembly includes:
   a roller; and
   a positioning member coupled to the carrier, the positioning member being configured to position and operate the roller over the paste and the surface of the circuit board such that the non-flammable flux provides lubrication and heat control between the roller and the surface of the circuit board.

6. The circuit board processing apparatus of claim 2 wherein the paste includes flux, and wherein the circuit board processing apparatus further comprises:
   a heater coupled to the carrier, the heater being configured to heat the paste to a temperature of at least 150 degrees Fahrenheit to facilitate chemical reaction between the flux and the virgin metallic surface mount pads.

7. The circuit board processing apparatus of claim 2 wherein the surfacing assembly includes:
   a rotating roller; and
   a positioning member coupled to the carrier, the positioning member being configured to position and operate the rotating roller over the paste and the surface of the circuit board in a lapping manner to remove a portion of each virgin metallic surface mount pad.

8. The circuit board processing apparatus of claim 7 wherein the rotating roller includes fiber-reinforced polyester material.

9. The circuit board processing apparatus of claim 7 wherein the positioning member is configured to position the rotating roller relative to the circuit board such that, after the portion of each virgin metallic surface mount pad is removed, the virgin metallic surface mount pads have substantially the same height.

10. The circuit board processing apparatus of claim 2 wherein the paste distribution assembly includes:
    a first paste dispenser which is configured to dispense the paste on a first side of the circuit board, and
    a second paste dispenser which is configured to dispense paste on a second side of the circuit board which is opposite the first side; and wherein the surfacing assembly includes:
  a first set of rollers which is configured to move the paste and the first side of the circuit board, and
  a second set of rollers which is configured to move the paste and the second side of the circuit board.

11. A method for processing a circuit board, the method comprising the steps of:
  receiving a circuit board having a section of circuit board material, and virgin metallic surface mount pads supported by the section of circuit board material;
  disposing a paste onto a surface of the circuit board; and
  moving the paste over the surface of the circuit board to remove a portion of each virgin metallic surface mount pad.

12. The method of claim 11 wherein the paste includes carbohydroxilate flux, and wherein the step of moving the paste over the surface of the circuit board includes the step of:
  working the paste over the virgin metallic surface mount pads of the circuit board in a lapping manner to chemically react the carbohydroxilate flux with the virgin metallic surface mount pads.

13. The method of claim 11 wherein the paste includes abrasive material and flux, and wherein the step of moving the paste over the surface of the circuit board includes the step of:
  working the paste over the virgin metallic surface mount pads of the circuit board in a lapping manner such that movement of the abrasive material over the virgin metallic surface mount pads exposes surfaces of the virgin metallic surface mount pads to the flux.

14. The method of claim 11 wherein the paste includes non-flammable flux, and wherein the step of moving the paste over the surface of the circuit board includes the step of:
  applying a roller to the paste and the surface of the circuit board such that the non-flammable flux provides lubrication and heat control between the roller and the surface of the circuit board.

15. The method of claim 11 wherein the paste includes flux, and wherein the method further comprises the step of:
  heating the paste to a temperature of at least 150 degrees Fahrenheit to facilitate chemical reaction between the flux and the virgin metallic surface mount pads.

16. The method of claim 11 wherein the step of moving the paste over the surface of the circuit board includes the step of:
  applying a rotating roller over the paste and the surface of the circuit board in a lapping manner to remove a portion of each virgin metallic surface mount pad.

17. The method of claim 16 wherein the rotating roller includes fiber-reinforced polyester material, and wherein the step of applying the rotating roller includes the step of:
  placing the fiber-reinforced polyester material of the rotating roller against the paste and the surface of the circuit board.

18. The method of claim 16 wherein the step of applying the rotating roller includes the step of:
  placing the rotating roller against the paste and the surface of the circuit board such that, after the portion of each virgin metallic surface mount pad is removed, the virgin metallic surface mount pads have substantially the same height.

19. The method of claim 11 wherein the step of disposing the paste onto the surface of the circuit board includes the step of:
  dispensing the paste on a first side of the circuit board, and on a second side of the circuit board which is opposite the first side; and
  wherein the step of moving the paste over the surface of the circuit board includes the step of:
    simultaneously applying a first set of rollers to the paste and the first side of the circuit board, and a second set of rollers to the paste and the second side of the circuit board.

20. A circuit board processing apparatus, comprising:
  a carrier which is configured to receive a circuit board having (i) a section of circuit board material, and (ii) virgin metallic surface mount pads supported by the section of circuit board material;
  a paste distribution assembly coupled to the carrier, the paste distribution assembly being configured to dispose a paste onto a surface of the circuit board; and
  means for moving the paste over the surface of the circuit board to remove a portion of each virgin metallic surface mount pad.

* * * * *